United States Patent
Lin et al.

(10) Patent No.: US 6,495,880 B2
(45) Date of Patent: Dec. 17, 2002

(54) METHOD TO FABRICATE A FLASH MEMORY CELL WITH A PLANAR STACKED GATE

(75) Inventors: Chrong Jung Lin, Hsin-Tian (TW); Jong Chen, Taipei (TW); Hung-Der Su, Kao-Hsiung (TW); Di-Son Kuo, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/760,309

(22) Filed: Jan. 16, 2001

(65) Prior Publication Data

US 2001/0012661 A1 Aug. 9, 2001

Related U.S. Application Data

(62) Division of application No. 09/257,722, filed on Feb. 25, 1999, now Pat. No. 6,190,969.

(51) Int. Cl.[7] ............................................. H01L 29/788
(52) U.S. Cl. ........................ 257/315; 257/314; 257/316
(58) Field of Search .............................. 257/315, 321, 257/314, 316, 317, 318

(56) References Cited

U.S. PATENT DOCUMENTS

| | | | | |
|---|---|---|---|---|
| 5,616,942 A | * | 4/1997 | Song | 257/316 |
| 5,625,213 A | * | 4/1997 | Hong et al. | 257/321 |
| 5,635,415 A | | 6/1997 | Hong | 438/261 |
| 5,643,813 A | | 7/1997 | Acocella et al. | 437/43 |
| 5,739,566 A | * | 4/1998 | Ota | 257/315 |
| 5,753,525 A | | 5/1998 | Hsu et al. | 437/43 |
| 5,998,262 A | * | 12/1999 | Chen | 257/316 |
| 6,008,090 A | * | 12/1999 | Wu | 438/260 |
| 6,051,467 A | * | 4/2000 | Chan et al. | 257/321 |
| 6,255,155 B1 | * | 7/2001 | Lee et al. | 257/315 |

* cited by examiner

*Primary Examiner*—David Nelms
*Assistant Examiner*—Andy Huynh
(74) *Attorney, Agent, or Firm*—George O. Saile; Stephen B. Ackerman; Douglas R Schnabel

(57) ABSTRACT

A new method of fabricating a stacked gate Flash EEPROM device having an improved stacked gate topology is described. Isolation regions are formed on and in a semiconductor substrate. A tunneling oxide layer is provided on the surface of the semiconductor substrate. A first polysilicon layer is deposited overlying the tunneling oxide layer. The first polysilicon layer is polished away until the top surface of the polysilicon is flat and parallel to the top surface of the semiconductor substrate. The first polysilicon layer is etched away to form the floating gate. The source and drain regions are formed within the semiconductor substrate. An interpoly dielectric layer is deposited overlying the first polysilicon layer. A second polysilicon layer is deposited overlying the interpoly dielectric layer. The second polysilicon layer and the interpoly dielectric layer are etched away to form a control gate overlying the floating gate. An insulating layer is deposited overlying the oxide layer and the control gate. Contact openings are formed through the insulating layer to the underlying control gate and to the underlying source and drain regions. The contact openings are filled with a conducting layer to complete the fabrication of the Flash EEPROM device.

12 Claims, 4 Drawing Sheets

METHOD TO FABRICATE A FLASH MEMORY CELL WITH A PLANAR STACKED GATE

This is a division of patent application Ser. No. 09/257,722, filing date Feb. 25, 1999, now U.S. Pat. No. 6,190,969. A Method To Fabricate A Memory Cell With A Planar Stacked Gate, assigned to the same assignee as the present invention.

BACKGROUND OF THE INVENTION (1) Field of the Invention

The invention relates to a method of fabricating semiconductor memory structures, and more particularly, to the formation of Flash Electically Erasable Programmable Read Only Memories (EEPROM) with a planar stacked gate.

(2) Description of the Prior Art

Flash EEPROMs are a well-known class of semiconductor devices in the art. These devices are used in many digital circuit applications where binary data must be retained even if the application system power is removed. Further, theses devices allow the data to be altered, or re-written, during normal operations.

EEPROM memory devices employ floating gates; that is Field Effect Transistor (FET) gates completely surrounded by an isolating layer such as silicon oxide. The presence of charge on these floating gates effectively shifts the threshold voltage of the FET. This effect can be detected by additional circuitry such that the charge state of the floating gate can be used to represent binary information. Specifically, FLASH EEPROM memories employ EEPROM cells in a configuration that allows for the bulk erasing, or flashing, of large blocks of memory cells in a normal circuit application without using any external data erasing source, such as ultra-violet light.

FIG. 1 shows a cross sectional view of a partially completed prior art EEPROM memory cell. The cell contains a substrate 11 typically composed of lightly P-doped monocrystalline silicon. Isolation regions 12 extend above and below the substrate surface to effectively isolate this memory cell from surrounding cells. The region defined along the substrate surface between the two isolation regions 12 is called the active region. A tunneling oxide layer 13 overlays the substrate 11 and the isolation regions 12. A polysilicon floating gate 14 overlays the tunneling oxide 13. The tunneling oxide 13 serves as an isolator between the floating gate 14 and the substrate 11. An interpoly dielectric film 15 of oxide-nitride-oxide, or ONO, overlays the floating gate 14. Another layer of polysilicon forms the control gate 16 of the memory cell. The interpoly dielectric film 15 serves as an isolator between the control gate 16 and the floating gate 14. The overlaying layers of control gate 16, interpoly dielectric 15, floating gate 14, and tunneling oxide 13 over substrate 11 form a stacking gate structure. Additional layers that are not shown include the typical N+ buried layer bit lines, metal layers used for connectivity, inter-metal dielectrics, and passivations.

Data is stored in the EEPROM cells by the storage of a charge on the floating gate 14. Because this gate 14 is electrically isolated from both the substrate 11 and the control gate 16, a charge can be stored for indefinite periods without any voltage applied to the gate 14. To charge or write data to the floating gate 14, a voltage must be applied from the control gate 16 to the substrate 11. This voltage is divided across the capacitor formed by the control gate 16, the interpoly dielectric 15, and the floating gate 14, and the capacitor formed by the floating gate 14, the tunneling oxide 13, and the substrate 11. If the voltage from the floating gate 14 to the substrate 11 is large enough, charge movement will occur as electrons tunnel from the substrate 11 to the floating gate 14 through the tunneling oxide layer 13. When the voltage from control gate 16 to substrate 11 is reduced or removed, the charge is trapped on the floating gate 14 and the data is retained in the memory cell. The presence of this charge increases the threshold voltage of the memory cell FET, and this can be detected by a cell sense circuit.

A prominent feature of the prior art is severe topology introduced by the field oxide 12 isolation. Because the polysilicon floating gate 14 overlaps this isolation 12, as well as the tunneling oxide layer 13, all of the subsequent layers of material reflect this topology.

This severe topology affects the stacking gate structure in the several adverse ways. First, the effective thickness L1 of the stacking gate in the center of the active region is different from the effective thickness L2 of the stacking gate near the isolation, region.

Second, the severe topology increases the occurrence and severity of polysilicon residue remaining between polysilicon traces after photolithographic etching. This can cause shorting between adjacent floating gates 14 and between adjacent control gates 16. Polysilicon residue also causes poor interpoly dielectric quality.

The third problem caused by the severe topology is active region trenching. As can be seen in the cross-sectional illustration, a lowered trench is formed over the active region due to the topology of the field oxide, isolation 12.

Prior art attempts to reduce the severe topology in the stacking gate caused by the field oxide isolation, have utilized a Chemical Mechanical Polishing (CMP) process after polysilicon floating gate deposition to plane the polysilicon layer. U.S. Pat. No. 5,643,813 to Acocella et al discloses a high density Flash EEPROM having an improved floating gate self-aligned process and teaches the use of a nitride layer over a recessed oxide to act as an etch stop for the polysilicon CMP step. U.S. Pat. No. 5,753,525 to Hsu et al shows an EEPROM with an improved coupling ratio. U.S. Pat. No. 5,739,566 to Ota shows a memory cell with self-aligned contacts. U.S. Pat. No. 5,635,415 to Hong shows a method for forming a buried bit line Flash EEPROM.

SUMMARY OF THE INVENTION

A principal object of the present invention is to provide an effective and very manufacturable method of fabricating a stacked gate Flash EEPROM device.

Another object of the present invention is to provide an effective and very manufacturable method of fabricating a stacked gate Flash EEPROM device having an improved stacked layer topology.

In accordance with the objects of this invention, a new method of fabricating a stacked gate Flash EEPROM device having an improved stacked layer topology is achieved. A semiconductor substrate is provided. Field oxide regions are formed in this substrate. A tunneling oxide layer is provided on the entire substrate surface. A first polysilicon layer is deposited overlying the tunneling oxide layer. This first polysilicon layer is polished away until it is flat, without exposing the tunneling oxide, field oxide, or substrate underlying the first polysilicon layer. The first polysilicon is then etched to define the floating gate. Source and drain regions associated with the floating gate are formed within the semiconductor substrate. An interpoly dielectric is deposited overlying the planar first polysilicon layer and the oxide layer. A second polysilicon layer is deposited overlying the interpoly dielectric. The second polysilicon layer and interpoly dielectric are then etched to define the control gate overlying the floating gate. An insulating layer is deposited overlying the control gate and the oxide layer. Contact openings are formed through the insulating layer to the underlying control gate and to the underlying source and drain regions. The contact openings are filled with a conducting layer to complete the fabrication of the Flash EEPROM device.

Also in accordance with the objects of this invention, a stacked gate Flash EEPROM device having an improved stacked layer topology is described. Field oxide isolations define active areas in the semiconductor substrate. A tunneling oxide overlies the semiconductor substrate. A polysilicon floating gate overlies the tunneling oxide. This polysilicon layer, where defined, has a flat topology. Source and gate regions lie within the semiconductor substrate. An interpoly dielectric overlies the polysilicon layer. A control gate of polysilicon overlies the interpoly dielectric. An insulating layer overlies the semiconductor substrate and the control gate. A patterned metal layer overlies the insulating layer and extends through contact openings in the insulating layer to the underlying control gate and to the underlying source and drain regions to complete the Flash EEPROM device.

BRIEF DESCRIPTION OF THE DRAWINGS

In the accompanying drawings forming a material part of this description, there is shown.

DESCRIPTION OF THE PREFERRED EMBODIMENTS

Figure 2:
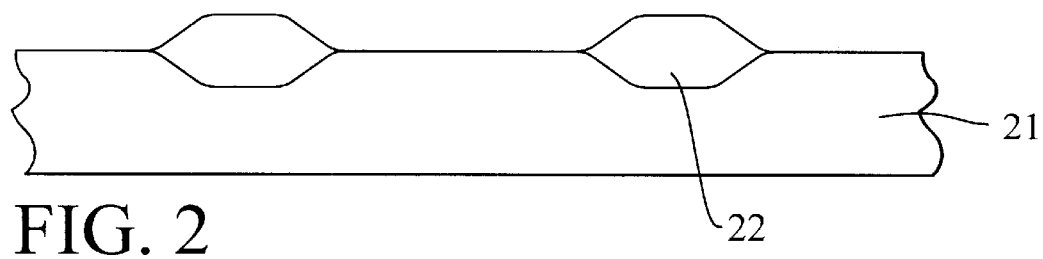
FIGS. 2 through 8 schematically illustrate in cross-sectional representation a preferred embodiment of the present invention.

Referring now more particularly to FIG. 2, there is illustrated a portion of a partially completed memory cell. Semiconductor substrate 21 is preferably composed of monocrystalline silicon. Isolation regions are formed in or on the semiconductor substrate 21 to isolate active regions from one another. For example, as shown in FIG. 2, field oxidation regions 22 are formed through the method known as local oxidation of silicon (LOCOS).

Figure 3:
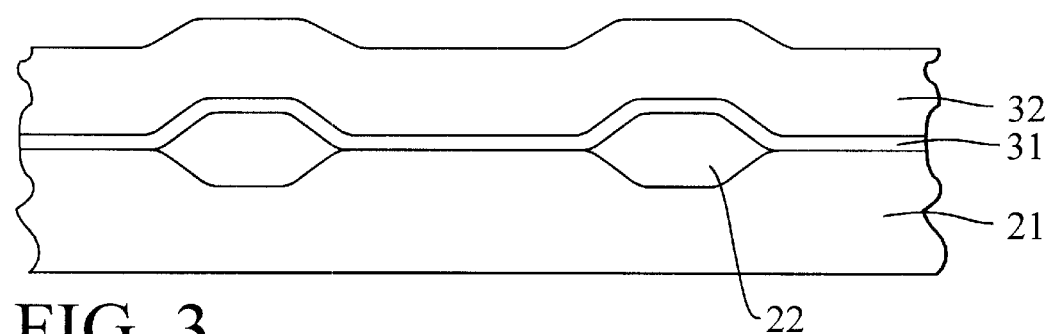

Further fabrication of the memory cell is depicted in FIG. 3. The surface of the substrate is oxidized to form the tunneling oxide layer 31 to a thickness of between about 70 and 150 Angstroms. A layer of polysilicon 32 is deposited over the surface of the substrate and tunneling oxide to a thickness of between about 500 and 2000 Angstroms.

Figure 4:
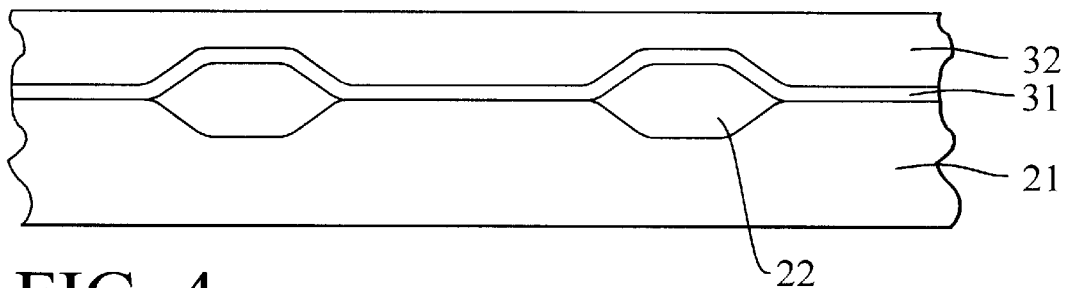

The key feature of the present invention to provide an improved stacking layer topology will now be described. The polysilicon layer 32 is subjected to a chemical mechanical polishing (CMP) step wherein the polysilicon surface is polished flat as shown in FIG. 4. While it is conventional in EEPROM processing to use CMP, this is typically only used in backend processing to planarize layers prior to metalization. The CMP process is timed to target a polysilicon layer 32 thickness between about 500 and 1000 Angstroms in the active area region overlying the tunneling oxide 31. The CMP process step is timed for a range of between about 5 to 20 seconds. Note that the polysilicon layer 32 still completely overlays the substrate 21 including the isolation regions. In the CMP step between about 30% and 60% of the polysilicon layer 32 is polished away.

Figure 5:
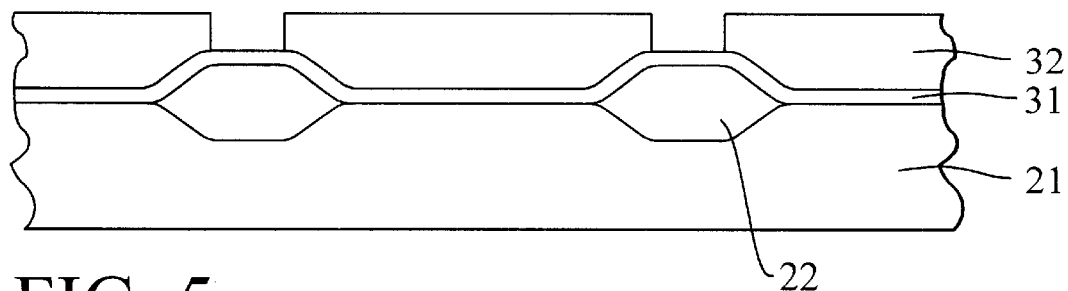

The polysilicon layer is patterned using a photolithographic process common to the art to form the floating gate 32, as shown in FIG. 5.

Figure 6:
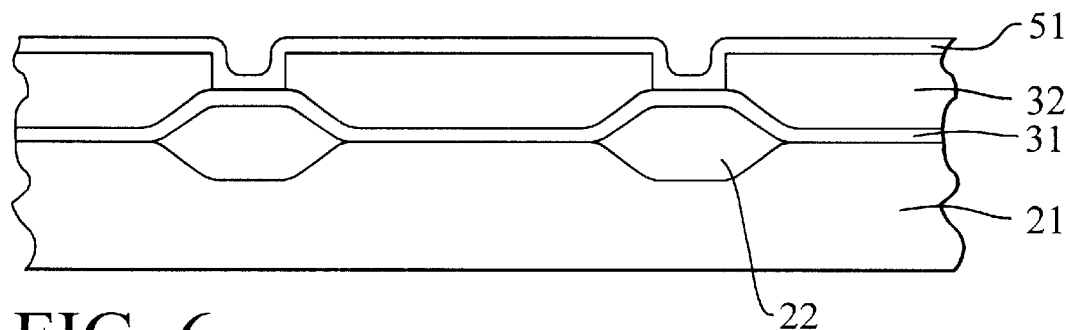

Referring now to FIG. 6, a laminated interpoly dielectric 51, such as ONO is deposited. Typically, the first layer of the ONO stack is silicon oxide having a thickness of between about 40 and 100 Angstroms. The second layer is silicon nitride having a thickness of between about 70 and 150 Angstroms. The topmost layer is another silicon oxide layer having a thickness of between about 30 and 60 Angstroms.

Figure 7:
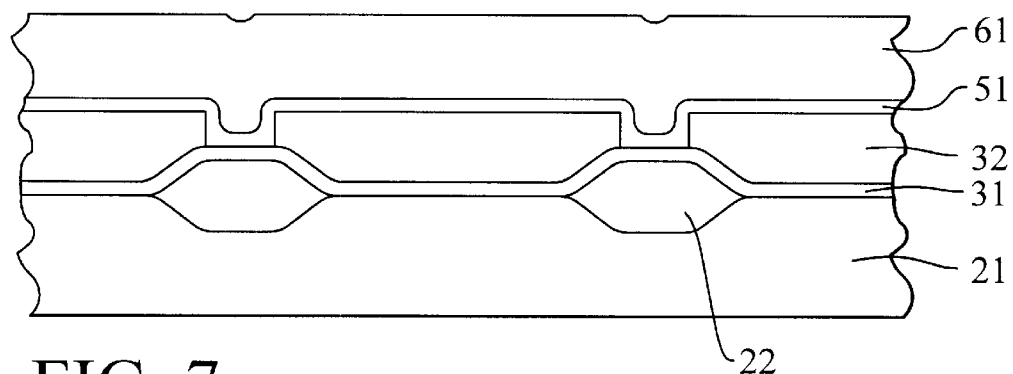

A second polysilicon layer 61 of thickness between about 1000 and 2500 Angstroms is deposited over the interpoly dielectric layer and doped as shown in FIG. 7. This polysilicon layer 61 will form the control of the memory cell.

Figure 8:
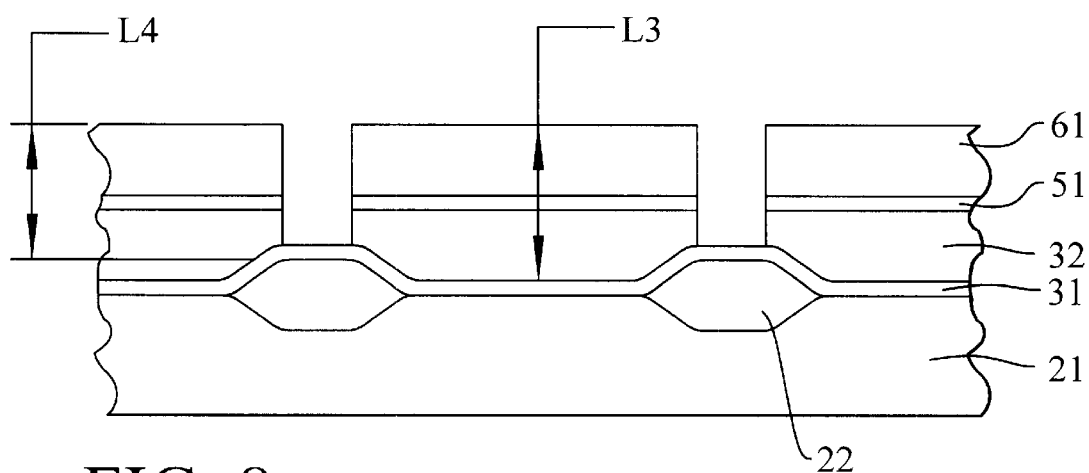

As shown in FIG. 8, a photolithographic process common to the art is used to define the stacked gate structure. The polysilicon control gate 61, interpoly dielectric 51, and polysilicon floating gate 32 are etched to form the stack.

Figure 1:
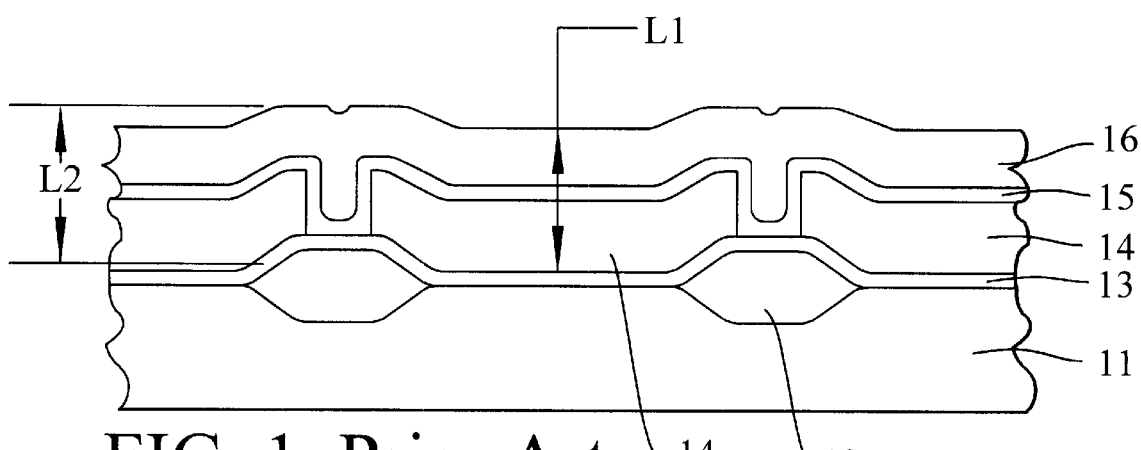
FIG. 1 schematically illustrates in cross-sectional, representation a Flash EEPROM structure in accordance with prior art.

It can now be demonstrated how the process features positively impact the performance and manufacturability of the memory cell. Compare the topology of the preferred embodiment version of the stacking gate depicted in FIG. 8 with the topology of the prior art stacking gate of FIG. 1. Through the use of the CMP process step, the polysilicon floating gate of the present invention is more planar, or flat. This facilitates a less severe topology for the entire stacking gate structure. This topology difference translates into several advantages for the preferred embodiment as compared to the prior art.

First, there is an improved relationship between the effective thickness L3 of the stacking gate in the center of the active region and the effective thickness L4 near the isolation regions. The improved relationship makes etching the stacked gate, particularly the second polysilicon, much easier.

Second, the flatter topology of the present invention reduces the likelihood of polysilicon residue after etch. The polished polysilicon surface is much more smooth and uniform than in the prior art. Charge loss from the floating polysilicon floating gate is reduced due to the smooth surface interface between first polysilicon and the ONO layer. This enhances the manufacturability of this Flash EEPROM by increasing device yield.

The third problem overcome by the topology advantage of the preferred embodiment is the elimination of active region trenching. As can be seen by comparing FIGS. 1 and 8, the active region of the stacking gate is more planar in the present invention.

Figure 9:
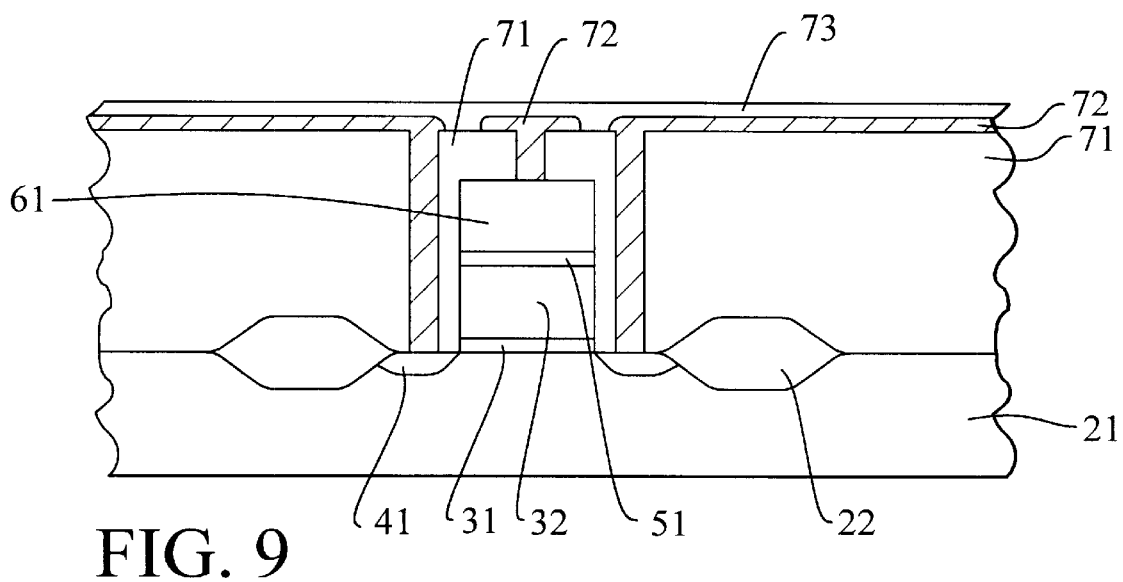
FIGS. 9 through 10 schematically illustrate in cross-sectional representation a completed memory cell of the present invention.
Figure 10:
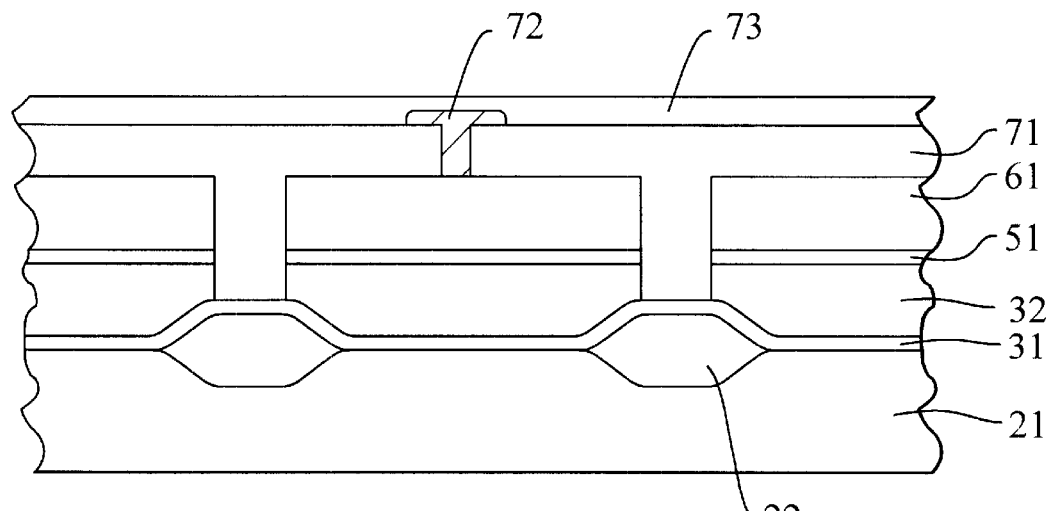

FIGS. 9 and 10 show a completed Flash EEPROM device fabricated according to the process of the present invention. FIG. 9 shows an alternative cross-sectional view that reveals the source and drain regions 41. The device is completed as is conventional in the art. As shown in FIG. 9, for example, a thick dielectric layer 71, such as borophosphosilicate glass (BPSG), phosphosilicate glass (PSG), or a combination of these materials, is deposited over the stacked control gate structure. Contact openings are etched through the dielectric layer to expose regions where contact is desired, such as the source and drain regions 41 and the control gate 61. Metal layer 72, typically aluminum, is deposited and patterned to complete the contacts. Passivation layer 73 covers the patterned metal layer.

The improved Flash EEPROM device having an improved stacking gate topology of the present invention will now be described with reference to FIGS. 9 and 10. A polysilicon floating gate 32 having a tunneling oxide layer 31 thereunder lies on the surface of a semiconductor substrate 21. The top surface of this polysilicon layer 32 is planar or flat. Associated source and drain regions 41 lie within the semiconductor substrate 21. An interpoly dielectric 51 overlies the floating gate 32. A polysilicon layer 61 overlies the interpoly dielectric 51 and the floating gate 32. This polysilicon layer 61 forms the control gate of the Flash EEPROM cell. An insulating layer 71 overlies the semiconductor substrate 21 and the control gate 61. A patterned metal layer 72 overlies the insulating layer 71 and extends through contact openings in the insulating layer to the underlying control gate 61 and the underlying source and drain regions 41 to complete the Flash EEPROM device.

The process of the present invention provides a very manufacturable process for fabricating a Flash EEPROM device having an improved stacking gate topology. The device improves on the prior art as described above and represents a new approach to EEPROM device processing.

While the invention has been particularly shown and described with reference to the preferred embodiments thereof it will be understood by those skilled in the art that various changes in form and details may be made without departing from the spirit and scope of the invention.

What is claimed is:

1. A Flash EEPROM device comprising:
   isolation regions on and in a semiconductor substrate to separate active device regions from one another wherein said isolation regions extend above and below the surface of said semiconductor substrate;
   a tunneling oxide layer on the surface of said semiconductor substrate and overlying said isolation regions;
   a first polysilicon layer overlying said tunneling oxide layer, said isolation regions and said semiconductor substrate wherein said polysilicon layer forms a floating gate and wherein the top surface of said floating gate is flat and parallel to the top surface of said semiconductor substrate;
   source and drain regions within said semiconductor substrate associated with said floating gate;
   an interpoly dielectric layer overlying said floating gate layer;
   a second polysilicon layer overlying said interpoly dielectric layer wherein said second polysilicon layer forms a control gate overlying said floating gate;
   an insulating layer overlying said control gate; and
   and a patterned metal layer overlying said insulating layer and extending through contact openings in said insulating layer to underlying said control gate and to underlying said source and drain regions completing said flash EEPROM device.

2. The device according to claim 1 wherein said, tunneling oxide layer is to a thickness of between about 70 and 150 Angstroms.

3. The device according to claim 1 wherein said floating gate comprises polysilicon having a thickness of between 500 and 2000 Angstroms.

4. The device according to claim 1 wherein said control gate comprises polysilicon having a thickness of between 1000 and 2000 Angstroms.

5. The device according to claim 1 wherein said interpoly dielectric layer comprises:
   a first layer of silicon oxide overlying said first polysilicon layer to a thickness of between about 40 and 100 Angstroms;
   a layer of silicon nitride overlying said first layer of silicon oxide to a thickness of between about 70 and 150 Angstroms; and
   a second layer of silicon oxide overlying said layer of silicon nitride to a thickness of between about 30 and 60 Angstroms.

6. The device according to claim 1 wherein the top surface of said first polysilicon layer is above the top surface of said isolation regions and said tunneling oxide layer.

7. A Flash EEPROM device comprising:
   local oxidation of silicon (LOCOS) isolation regions on and in a semiconductor substrate to separate active device regions from one another wherein said isolation regions extend above and below the surface of said semiconductor substrate;
   a tunneling oxide layer on the surface of said semiconductor substrate and overlying said isolation regions;
   a floating gate overlying said tunneling oxide layer wherein the top surface of said floating gate is flat and parallel to the top surface of said semiconductor substrate;
   source and drain regions within said semiconductor substrate associated with said floating gate;
   an interpoly dielectric layer overlying said floating gate;
   a control gate overlying said interpoly dielectric layer;
   an insulating layer overlying said control gate; and
   a patterned metal layer overlying said insulating layer and extending through contact openings in said insulating layer to underlying said control gate and to underlying said source and drain regions completing said Flash EEPROM device.

8. The device according to claim 7 wherein said tunneling oxide layer is to a thickness of between about 70 and 150 Angstroms.

9. The device according to claim 7 wherein said floating gate comprises polysilicon having a thickness of between 500 and 2000 Angstroms.

10. The device according to claim 7 wherein said control gate comprises polysilicon having a thickness of between 1000 and 2000 Angstroms.

11. The device according to claim 7 wherein said interpoly dielectric layer comprises:
    a first layer of silicon oxide overlying said floating gate to a thickness of between about 40 and 100 Angstroms;
    a layer of silicon nitride overlying said first layer of silicon oxide to a thickness of between about 70 and 150 Angstroms; and
    a second layer of silicon oxide overlying said layer of silicon nitride to a thickness of between about 30 and 60 Angstroms.

12. The device according to claim 7 wherein the top surface of said floating gate is above the top surface of said LOCOS isolation regions and said tunneling oxide layer.

* * * * *

UNITED STATES PATENT AND TRADEMARK OFFICE
CERTIFICATE OF CORRECTION

PATENT NO. : 6,495,880 B2
DATED : December 17, 2002
INVENTOR(S) : Chrong Jung Lin et al.

It is certified that error appears in the above-identified patent and that said Letters Patent is hereby corrected as shown below:

<u>Title page,</u>
Item [75], please delete "Chrong Jung Lin, Hsin-Tian, (TW)" and replace it with
-- Chrong Jung Lin, Hsin-Tien City, (TW) --.

Signed and Sealed this

Third Day of June, 2003

JAMES E. ROGAN
*Director of the United States Patent and Trademark Office*